United States Patent [19]
Hokari et al.

[11] Patent Number: 5,904,494
[45] Date of Patent: May 18, 1999

[54] FABRICATION PROCESS FOR SOLID-STATE IMAGE PICK-UP DEVICE WITH CCD REGISTER

[75] Inventors: Yasuaki Hokari; Chihiro Ogawa, both of Tokyo, Japan

[73] Assignee: NEC Corporation, Tokyo, Japan

[21] Appl. No.: 08/835,412

[22] Filed: Apr. 9, 1997

[30] Foreign Application Priority Data

Apr. 9, 1996 [JP] Japan .................................. 8-086167

[51] Int. Cl.$^6$ .................................................. H01L 21/00
[52] U.S. Cl. ........................................................... 438/60
[58] Field of Search ................................ 438/57, 60, 59, 438/61, 67

[56] References Cited

U.S. PATENT DOCUMENTS 5,424,775  6/1995  Kamisaka et al. ...................... 348/311

OTHER PUBLICATIONS

R.M. Anderson et al., "Evidence for surface asperity mechanism of . . . on polycrystalline silicon", *Journal of Applied Physics,* vol. 48, No. 11, Nov. 1977, pp. 4834–4836.

D.K. Brawn et al., "Ramp Breakdown Study . . . RAM's as a Function of Fabrication Parameters", *J. Electrochem. Soc.: Solid–State Science and Technology,* vol. 130, No. 7, Jul. 1983, pp. 1597–1603.

K. Shinada et al., "Reduction in Polysilicon Oxide Leakage Current by Annealing prior to Oxidation", *J. Electrochem. Soc.: Solid–State Science and Technology,* vol. 132, No. 9, Sep. 1995, pp. 2185–2188.

*Primary Examiner*—Charles Bowers
*Assistant Examiner*—Craig Thompson
*Attorney, Agent, or Firm*—Sughrue, Mion, Zinn, Macpeak & Seas, PLLC

[57] ABSTRACT

At first, first transfer electrodes are formed selectively on a semiconductor substrate. Then, the surface of the first transfer electrodes are thermally oxidized at a temperature of 850° to 950° C. to form thermal oxide layers. After depositing a polycrystalline silicon layer over the substrate, rapid annealing is performed the first transfer electrodes, the thermal oxide layers and the polycrystalline silicon layer by a halogen lamp. Thus, after forming the polycrystalline silicon layer to be second transfer electrodes, annealing is performed by heating by lamp. Therefore, the thermal oxide layers can be efficiently heated by the irradiation heat from the polycrystalline silicon layer located upper side thereof and also from the first electrodes located at backside. Accordingly, the tolerance voltage of the thermal oxide layer can be improved and the thickness of the thermal oxide layer can be made thinner.

18 Claims, 6 Drawing Sheets

FABRICATION PROCESS FOR SOLID-STATE IMAGE PICK-UP DEVICE WITH CCD REGISTER

BACKGROUND OF THE INVENTION

1. Field of the Invention

The present invention relates to a fabrication process of a solid-state image pick-up device with a CCD register which can improve a tolerance voltage of an insulation layer formed between transfer electrodes.

2. Description of the Prior Art

FIG. 1 is a plan view illustrating a construction of the conventional CCD type two-dimensional solid-state image pick-up device. A plurality of photodiodes 101 for photoelectric conversion are arranged in a form of a matrix array on a substrate. Vertical CCD registers 102 for transferring a charge in vertical direction are provided between respective row of the photodiodes 101. A horizontal CCD register 103 for transferring a charge in the horizontal direction is connected to the vertical CCD registers 102. A charge detector 104 for detecting a charge and an amplifier 105 for amplifying the output of the charge detector 104 are connected to one end of the horizontal CCD register 103.

In the solid-state image pick-up device constructed as set forth above, an image pattern is projected on the solid-state image pick-up device, at first. Then, charge depending upon intensity of the incident light on each of photodiodes 101 arranged in the matrix array is accumulated in each individual photodiode 101. Next, as time elapsed, the accumulated charge is shifted in the direction shown by arrow 110 and thus transferred to the vertical CCD register 102.

Next, the charge is transferred to the vertical CCD register 102 in the direction shown by arrow 111, to reach the horizontal CCD register 103. Subsequently, the charge is transferred in the horizontal CCD register 103 in a direction shown by arrow 112. Then, the charge is converted into a voltage in the charge detector 104 and thereafter output via the amplifier 105.

FIG. 2 is an illustration showing a part of section taken along line II—II of FIG. 1. A structure of unit pixel of the conventional CCD type two-dimensional solid-state image pick-up device will be discussed with reference to FIG. 2. A P-type well layer 21 is formed on the surface of an N-type semiconductor substrate 11. An N-type impurity region 13 to be a photodiode is selectively formed on the surface of the well layer 21. A high density P-type impurity region 25 is formed on the surface of the N-type impurity region 13. One side of the P-type impurity region 25 is positioned inside of the N-type impurity region 13 and the other side reaches the side surface of the N-type impurity region 13.

A P-type impurity region 26 to be a channel of MOS transistor is formed in the shallower region, adjacent one side of the N-type impurity region 13. An N-type impurity layer 15 to form the CCD register is formed adjacent the P-type impurity region 26. Also, a P-type impurity layer 23 is formed in a region facing with the lower surface of the N-type impurity layer 15. A high density P-type impurity layer 24 for isolation device is formed adjacent the other side of the N-type impurity region 13. The N-type impurity layer 15 and the P-type impurity layer 23 forming CCD register are formed via the P-type impurity layer 24.

Also, a gate insulation layer 31 is formed over the entire surface. A charge transfer electrode group 41 of polycrystalline silicon is formed selectively except for the region aligned with the P-type impurity region 25 on the surface of the gate insulation layer 31. On the entire surface of these, an interlayer insulation layer 33 is formed. A light shielding layer 51 preventing light from penetrating into a CCD channel (N-type impurity layer 15) is formed in a region aligning with the charge transfer electrode group 41 on the surface of the interlayer insulation layer 33.

In the unit pixel constructed as set forth above, a pn junction photodiode is formed with the N-type impurity region 13 and the P-type well layer 21. Accordingly, an incident light 61 of the N-type impurity region 13 from the upper side of the device is subject photoelectric conversion. Electron generated by this is accumulated in the N-type impurity region 13. At this time, the high density P-type impurity region 25 serves for reducing current generated at $Si/SiO_2$ interface.

On the other hand, a MOS transistor is formed with the N-type impurity region 13, the CCD channel (N-type impurity layer 15) and the P-type impurity region 26. Accordingly, when a voltage pulse in a range of 10 to 15 V is applied to the charge transfer electrode group 41, the charge accumulated in the photodiode (N-type impurity region 13) can be transferred to the CCD channel (N-type impurity layer 15).

Subsequently, applying a voltage pulse in a range of −5 to −10 V to the charge transfer electrode group 41, the electron is transferred in the CCD channel (N-type impurity layer 15) in the direction shown by arrow 111 in FIG. 1. At this time, since the P-channel impurity region 26 serving as a channel of the MOS transistor becomes in cut-off condition, the charge accumulated in the photodiode (N-type impurity region 13) will never be discharged to the CCD channel.

FIG. 3 is a section taken along line III—III of FIG. 1. Structure of the CCD register of the conventional CCD type two-dimensional solid-state image pick-up device will be described with reference to FIG. 3. In FIG. 3, the N-type semiconductor substrate 11 and the P-type impurity layer 23 shown in FIG. 2 has been neglected.

As shown in FIG. 3, the N-type impurity layer 15 is formed on the surface of the P-type well layer (semiconductor substrate) 21. The gate insulation layer 31 is formed on the surface of the N-type impurity layer 15.

First transfer electrodes 4 made of a polycrystalline silicon are formed with a given interval on the surface of the gate insulation layer 31, and the surface thereof is covered with a thermal oxide layer 6. Second transfer electrodes 5 made of polycrystalline silicon are formed via the thermal oxide layer 6 between respective of the first transfer electrodes 4. The charge transfer electrode group 41 is formed with these first transfer electrodes 4 and the second transfer electrodes 5. Also, the first transfer electrodes 4 and the second transfer electrodes 5 are connected to four voltage supply lines 7a, 7b, 7c and 7d, respectively in the sequential order of arrangement of the lines.

In the CCD register constructed as set forth above, the foregoing voltage pulse in the range of −5 to −10 V is applied to the first transfer electrodes 4 and the second transfer electrodes 5 forming the charge transfer electrode group 41. FIG. 4 is an illustration showing a voltage pulse waveform to be applied to the transfer electrodes from the voltage supply lines 7a to 7d. Four phase pulse voltages of $\phi a$ to $\phi d$ are applied from the four voltage supply lines 7a to 7d. As the pulse voltage, a pulse voltage having a reference voltage of 0 V and amplitude of −5 to −10 V may be employed, for example. Then, the electron is transferred in the N-type impurity layer 15 as the CCD channel in the direction shown by allow 111.

FIGS. 5A to 5D are sections showing fabrication process of the CCD register in order of sequence. As shown in FIG. 5A, the N-type impurity layer 15 is formed on the surface of the P-type well layer 21, employing known technology. Then, the gate insulation layer 31 is formed on the N-type impurity layer 15.

Next, as shown in FIG. 5B, a polycrystalline silicon layer (not shown) is deposited on the surface of the gate insulation layer 31 by way of CVD method or the like. By selectively removing the polycrystalline silicon layer, the first transfer electrodes 4 are formed. It should be noted that, upon deposition of the polycrystalline silicon, if impurity such as phosphorous or the like, is not doped in the polycrystalline silicon layer, a process step to diffuse impurity, such as phosphorous by way of thermal diffusion method after deposition of the polycrystalline silicon layer. Next, the thermal oxide layer 6 is formed by thermal oxidation of the surface of the first transfer electrode 4.

Subsequently, over these surfaces, a polycrystalline silicon layer 5a is deposited.

Then, as shown in FIG. 5D, a portion of the polycrystalline silicon layer 5a above the first transfer electrodes 4 is selectively removed. By this, the second transfer electrodes 5 are formed. The conventional CCD register is thus fabricated.

A In the conventional CCD register, the charge transfer electrode group 41 has a function to read out the charge from the photodiodes (N-type impurity region 13) to the vertical CCD channel (N-type impurity layer 15) and a function to transfer the charge in the CCD channel. Accordingly, the pulse voltage in a range up to 15 V is applied to the thermal oxide layer 6 isolating between the first transfer electrodes 4 and the second transfer electrodes 5.

However, the thermal oxide layer 6 formed by thermal oxidation of the surface of the first transfer electrode 4 made of the polycrystalline silicon, has low tolerance voltage, and, in general, can obtain electric field strength of merely about 1 to 2 (MV/cm). Accordingly, in order to obtain the tolerance voltage of 15 V, the thermal oxide layer 6 should be formed in the thickness greater than or equal to 0.2 μm. Particularly, in case of the solid-state image pick-up device having large area, lack of tolerance voltage of the thermal oxide layer 6 inherently lower yield significantly.

When the thickness of the thermal oxide layer 6 is increased seeking for improvement of the tolerance voltage, a step to be formed between the portion where the first and second transfer electrodes 4 and 5 overlap to each other and the portion where the transfer electrodes are not formed (photodiode portion) becomes greater than or equal to 1 μm. By this, coverage of the metal electrode layer (light shielding layer 51) to be formed on the surface of the charge transfer electrode group 41 is lowered at the step portion and the metal electrode layer becomes thin in the vicinity of the step portion. If the thin layer portion is formed in the metal electrode layer, and the light penetrates into the CCD register, the penetrated light is converted into the charge by photoelectric conversion in the CCD. Then, such charge is added to the signal charge to be a pseudo signal to cause lowering of S/N ratio.

When the metal electrode layer (light shielding layer 51) is used as wiring, breakage of the wiring can be caused at the step portion. By this, voltage cannot be applied to the transfer electrode.

In this fact, in the insulation layer between the polycrystalline silicon layers to be the transfer electrode, it has been strongly demanded to form insulation layer which is thin in the thickness and can improve tolerance voltage.

In general, as one of causes of low tolerance voltage of the thermal oxide layer (insulation layer) formed on the polycrystalline silicon layer, the surface of the polycrystalline silicon layer at the interface between the polycrystalline silicon layer and the thermal oxide layer after thermal oxidation is unevenness. Thus, for planarizing the surface of the polycrystalline silicon layer to improve the tolerance voltage of the thermal oxide layer, there has been proposed a method to perform oxidation of the surface of the polycrystalline silicon layer to be the transfer electrode at high temperature higher than or equal to 1000° C. (R. M. Anderson et al., "Evidence for surface asperity mechanism of conductivity in oxide grown on polycrystalline silicon", Journal of Applied Physics, Vol. 48, No. 11, 1977, pp 4834–4836). This will be hereinafter referred to as "first prior art".

When the thermal oxide layer is formed by the first prior art, mechanical strain caused at the interface of the polycrystalline silicon layer and the thermal oxide layer can be reduced by oxidation process at high temperature to reduce unevenness at the interface.

Also, there has been proposed a method to planarizing the surface of the polycrystalline silicon layer. (K, Shinada et al., "Reduction in Polysilicon Oxide Leakage Current by Annealing prior to Oxidation", Journal of Electrochemical Society, SOLID-STATE SCIENCE AND TECHNOLOGY, Vol. 132, No. 9, 1985, pp 2185–2188). The proposed technology is to enlarge crystal grain size of the polycrystalline silicon layer by appropriately defining phosphorous concentration in the polycrystalline silicon or by performing annealing process to the polycrystalline silicon layer before oxidation of the surface of the polycrystalline silicon layer, for planarizing the surface of the polycrystalline silicon. This will be hereinafter referred to as "second prior art".

Also, there has been proposed a method for reducing unevenness of interface between the polycrystalline silicon and the thermal oxide layer for improving tolerance voltage by providing annealing process for the thermal oxide layer at high temperature after oxidation of the polycrystalline silicon layer. (D. K. Brown et al., "Ramp Breakdown Study of Double Polysilicon RAM's as a Function of Fabrication Parameters", Journal of Electrochemical Society, SOLID-STATE SCIENCE AND TECHNOLOGY, Vol. 130, No. 7, 1983, pp 1597–1603). This will be hereinafter referred to as "third prior art". However, even by the first to third prior arts set forth above, it has not been possible to sufficiently improve the tolerance voltage of the insulation layer. Furthermore, since the foregoing prior arts require heat treatment at high temperature higher than or equal to 1000° C, if such prior art is applied to the solid-state image pickup device, diffusion depth of the PN junction can be restricted. Accordingly, these technology is difficult to apply for the solid-state image pick-up device.

SUMMARY OF THE INVENTION

It is an object of the present invention to provide a fabrication process of a solid-state image pick-up device with a CCD register by enhancing a tolerance voltage of an insulation layer formed between electrodes made of polycrystalline silicon and improving yield.

Another object of the invention is to provide a fabrication process of a solid-state image pick-up device with a CCD register which can make the thickness of the insulation layer thinner, reduces step between respective electrode layers, enhances light shielding ability of a metal wiring (light shielding layer) formed on the electrode layer, and prevent the wiring from causing breakage.

A fabrication process of a solid-state image pick-up device with a CCD register according to the present invention, at first, first electrodes of polycrystalline silicon are selectively formed on a semiconductor substrate. Thermal oxide layers are formed by thermal oxidizing the surfaces of the first electrodes. A polycrystalline silicon layer is then formed over the substrate. Subsequently, annealing is performed the first electrodes, the thermal oxide layers and the polycrystalline silicon layer at a temperature higher than or equal to 1000° C. by heating by lamp. Then, the polycrystalline silicon layer is patterned to form second electrodes between the first electrodes.

The fabrication process may further comprise a step of diffusing impurity in the polycrystalline silicon layer between the step of forming the polycrystalline silicon layer and the step of performing annealing. An insulation layer may be on the surface of the polycrystalline silicon layer between the step of diffusing the impurity and the step of performing annealing.

The step of forming the thermal oxide layer may be the step of thermally oxidizing the surface of the first electrode at a temperature of 800 to 950° C. The thickness of the thermal oxide layer may be 0.1 to 0.15 μm. Also, the annealing may be performed at a temperature in a range of 1000 to 1200° C. However, it should be noted that the layer thickness and the temperature set forth above are not essential and the present invention should not be limited to the specific ranges.

A fabrication process of a solid-state image pick-up device with a CCD register according to the present invention, at first, first electrodes of polycrystalline silicon are selectively formed on a semiconductor substrate. Thermal oxide layers are formed by thermal oxidizing the surfaces of the first electrodes. Then a polycrystalline silicon layer is formed over the substrate. Subsequently, the polycrystalline silicon layer is patterned to form second electrodes between the first electrodes. Thereafter annealing is performed the first electrodes, the thermal oxide layers and the second electrodes at a temperature higher than or equal to 1000° C. by heating by lamp.

The fabrication process may further comprise a step of diffusing impurity in the polycrystalline silicon layer between the step of forming the polycrystalline silicon layer and the step of forming second electrodes. Also, the fabrication process may further comprises a step of forming an insulation layer on the surface of the second electrodes between the step of forming the second electrodes and the step of performing annealing.

The step of forming the thermal oxide layer may be the step of thermally oxidizing the surface of the first electrode at a temperature of 800 to 950° C. The thickness of the thermal oxide layer may be 0.1 to 0.15 μm. Also, the annealing may be performed at a temperature in a range of 1000 to 1200° C. However, it should be noted that the layer thickness and the temperature set forth above are not essential and the present invention should not be limited to the specific ranges.

In the present invention, after forming the polycrystalline silicon layer to be the second electrodes on the surface of the first electrode via the thermal oxide layer, annealing is performed by heating with the lamp, the thermal oxide layer can be heated efficiently from the first electrode side and from the polycrystalline silicon layer side to be the second electrodes. Thus, tolerance voltage of the thermal oxide layer can be improved, and thus the thickness of the thermal oxide layer can be reduced.

Also, in the solid-state image pick-up device having large area, yield in fabrication significantly affected by lack of tolerance voltage of the thermal oxide layer between the electrodes. In the present invention, since the tolerance voltage can be enhanced, the yield in fabrication of the solid-state image pick-up device can be significantly improved.

Furthermore, in the present invention, since the thermal oxide later can be formed to be thinner, a step between the region where the electrodes are formed and the region where the electrodes are not formed can be reduced. Accordingly, local thinning of the light shielding layer to be formed on the surface of the electrodes can prevent satisfactorily the light from penetrating into the electrodes. When the light shielding layer is formed as metal wiring, breakage of the wiring at the step can be satisfactorily avoided.

BRIEF DESCRIPTION OF THE DRAWINGS

The present invention will be understood more fully from the detailed description given hereinafter and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however to those skilled in the art that the present invention may be practiced without these specific details. In other instance, well-known structures are not shown in detail in order to avoid unnecessary obscure the present invention.

Figure 6A:
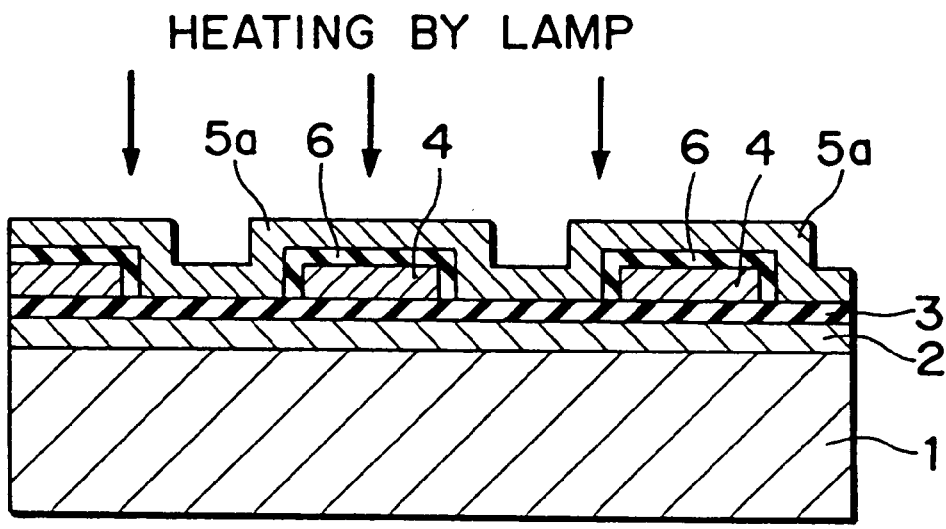
FIGS. 6A and 6B are sections showing process steps of the first embodiment of a fabrication process of a solid-state image pick-up device with a CCD register according to the present invention, in sequential order.
Figure 6B:
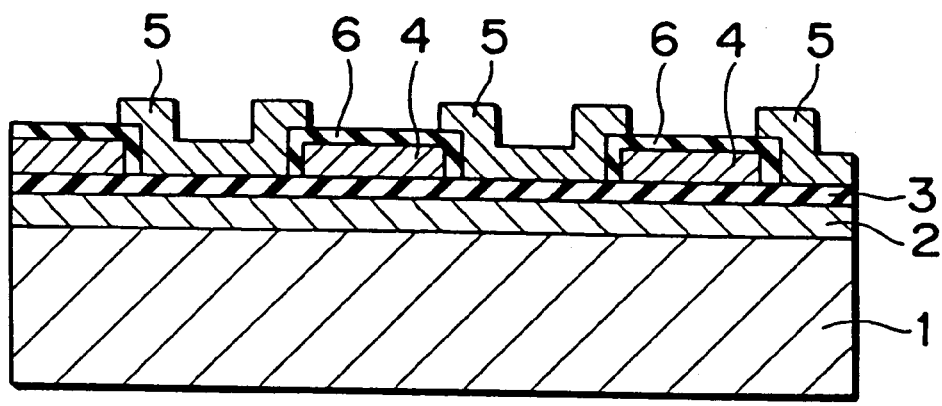

FIGS. 6A and 6B are sections showing process steps in the first embodiment of a fabrication process of a solid-state image pick-up device with a CCD register according to the present invention.

As shown in FIG. 6A, an N-type impurity layer 2 is formed on the surface of a P-type semiconductor substrate 1 by way of known technology. A gate insulation layer 3 is formed on the surface of the N-type impurity layer 2. As the gate insulation layer 2, a $SiO_2$ layer obtained by thermal oxidation of the surface of the P-type semiconductor substrate 1 may be employed. Also, the gate insulation layer 3 may also be formed with a layer consisted of an oxide layer/nitride layer or an oxide layer/nitride layer/oxide layer formed by stacking $SiO_2$ layer and $Si_3N_4$.

Next, a polycrystalline silicon layer (not shown) is deposited on the surface of the gate insulation layer 3 by way of CVD method or the like. First transfer electrodes 4 are formed by selectively removing the polycrystalline silicon layer. Then, a thermal oxide layer 6 is formed by thermal oxidation of the surface of the first transfer electrodes at a temperature in a range of 800 to 950° C. The thickness of the thermal oxide layer 6 may be selected depending upon a voltage to be applied to the electrode, but the thickness is preferred to be in a range of 0.1 to 0.15 µm.

Subsequently, rapid annealing is performed by a halogen lamp for the entire substrate after depositing a polycrystalline silicon layer 5a over the entire surface. When impurity, such as phosphorous or the like, is doped in the polycrystalline silicon layer 5a upon deposition of the polycrystalline silicon layer 5a, immediately after depositing the layer 5a, the rapid annealing can be performed. On the other hand, when the phosphorous or the like is not doped into the polycrystalline silicon layer 5a upon deposition, the rapid annealing is performed after diffusing phosphorous or the like into the polycrystalline silicon layer 5a by thermal diffusion method.

It is desirable to perform annealing at high temperature as high as possible, and the preferred condition to perform annealing at a temperature in a range of 1000 to 1200° C. for a several tens seconds. While annealing process can be performed under $N_2$ gas or inert gas atmosphere, no adverse influence will be caused for the effect of the present invention even when annealing is performed under $O_2$ containing atmosphere. It should be noted that even when the insulation layer is formed on the surface of the polycrystalline silicon layer 5a before performing rapid annealing, no adverse influence should be caused on the effect of the present invention. When the insulation layer is formed on the surface of the polycrystalline silicon layer before annealing, the insulation layer prevent phosphorous in the polycrystalline silicon layer or the like from discharging outside.

Then, as shown in FIG. 6B, a portion of the polycrystalline silicon layer 5a above the first transfer electrodes 4 is selectively removed by etching, to form the second transfer electrodes 5.

In the shown embodiment, after forming the polycrystalline silicon layer to be first transfer electrodes 4, the thermal oxide layer 6 and the polycrystalline silicon layer to be the second transfer electrodes 5, rapid annealing is performed. By this, the thermal oxide layer can be fluidized, and the interface between the polycrystalline silicon layers and the thermal oxide layer is smoothed. Therefore, By forming the thermal oxide layer 6, mechanical strain to be cause on the interface can be reduced to enhance tolerance voltage of the thermal oxide layer 6.

When annealing process is performed in order to improve tolerance voltage of the thermal oxide layer, annealing process is typically performed immediately after formation of the thermal oxide layer. In the shown embodiment, after forming the polycrystalline silicon layer 5a on the thermal oxide layer 6, lamp heating for annealing process is performed. Therefore, a part of the irradiated light is absorbed in the polycrystalline silicon layer 5a. The irradiated light is also absorbed in the P-type semiconductor substrate 1. Accordingly, a heat supplied by the lamp can be effectively used to heat the upper surface side and back surface side of the thermal oxide layer. Thus, the thermal oxide layer 6 can be heated efficiently to further improve tolerance voltage of the thermal oxide layer.

Since the tolerance voltage of the thermal oxide layer 6 can be improved as set forth above, the thickness of the thermal oxide layer 6 can be set further thinner. Accordingly, the step between the portion where the first transfer electrodes 4 and the second transfer electrodes 5 overlap and the portion where the electrodes are not formed can be reduced. Therefore, the light shielding layer may not be locally formed thin portion to satisfactorily prevent penetration of light into the electrodes 4 and 5. Also, when the light shielding layer as the metal wiring is formed on the electrodes, breakage of wiring at the step can be successfully prevented.

With the shown embodiment as set forth above, the performance of the device can be enhanced, and yield in fabrication can be improved.

Figure 7:
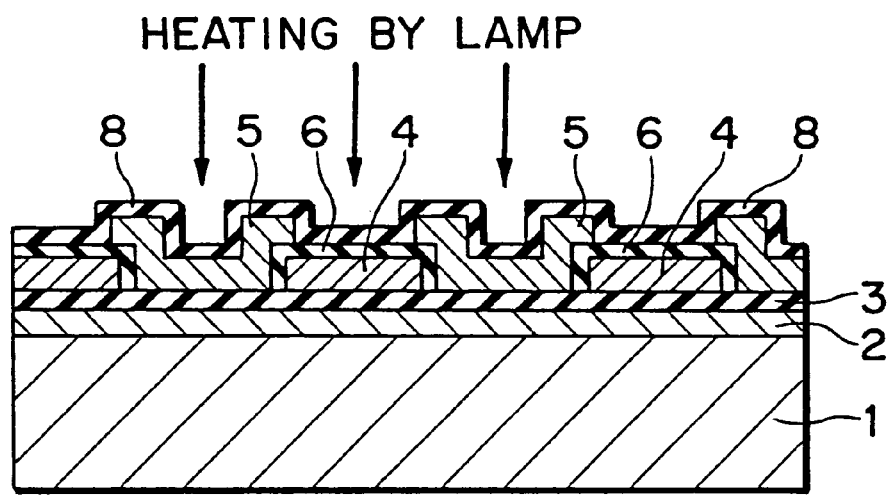
FIG. 7 is a section showing the second embodiment of a fabrication process of a solid-state image pick-up device with a CCD register according to the present invention.

FIG. 7 is a section showing the second embodiment of a fabrication process of the solid-state image pick-up device with the CCD register according to the present invention. In the CCD register shown in FIG. 7, like elements to those in the CCD register shown in FIGS. 6A and 6B are identified by like reference numerals and detailed description therefor will be neglected.

The second embodiment is differentiated from the first embodiment only in timing to perform annealing process. Namely as shown in FIG. 6A, up to the step of forming the polycrystalline silicon layer 5a via the thermal oxide layer 6 on the first transfer electrodes 4, the process is the same as those of the first embodiment.

Thereafter, the portion of the polycrystalline silicon layer 5a above the first transfer electrodes 4 is selectively removed. By this, the second transfer electrodes 5 are formed. Then, as shown in FIG. 7A, after formation of the insulation layer 8 over the entire surface, rapid annealing is performed. The condition of the annealing process can be similar to those of the first embodiment. By this, similarly to the first embodiment, the tolerance voltage of the thermal oxide layer 6 can be improved. It should be noted that, while the rapid annealing is performed after formation of the insulation layer 8 in the shown embodiment, it is possible to perform rapid annealing without forming the insulation layer.

Figure 8:
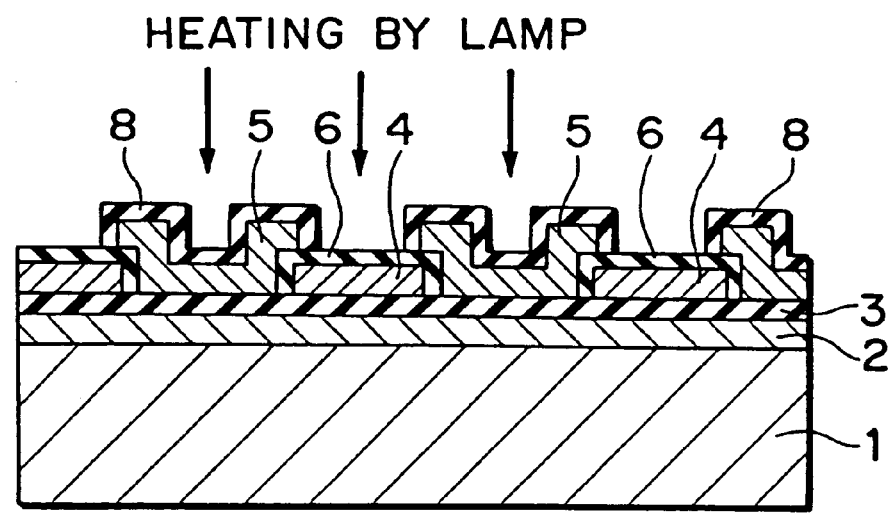
FIG. 8 is a section showing the third embodiment of a fabrication process of a solid-state image pick-up device with a CCD register according to the present invention.

FIG. 8 is a section showing the third embodiment of a fabrication process of the solid-state image pick-up device with the CCD register according to the present invention. The third embodiment shown in FIG. 8 is differentiated from the second embodiment only in that the insulation layer 8 is formed only on the surface of the second transfer electrodes. Accordingly, in the CCD register shown in FIG. 8, the like elements to those shown in FIG. 7 will be identified by like reference numerals and the detailed description therefor will be neglected.

Namely, in the shown embodiment, the insulation layer 8 is formed only on the surface of the second transfer electrodes 5 after formation of the second transfer electrodes 5.

Subsequently, rapid annealing is performed by light heating from the upper side of the substrate 1. Even in the third embodiment, similarly to the first and second embodiments, tolerance voltage of the thermal oxide layer 6 can be improved.

The embodiment of the fabrication process of the solid-state image pick-up device with the CCD register according to the present invention will be discussed in comparison with a comparative example.

At first, the solid-state image pick-up devices with the CCD registers were fabricated in various fabrication process. In each solid-state image pick-up device, the tolerance voltages of the thermal oxide layers were evaluated. The CCD register in the solid-state image pick-up device has a structure (MIM structure), in which the first transfer electrode, the thermal oxide layer (insulation layer) and the second transfer electrode are stacked in sequential order. This test is that, in the process forming the MIM structure, timing for performing the high temperature rapid annealing process is varied.

Figure 9:
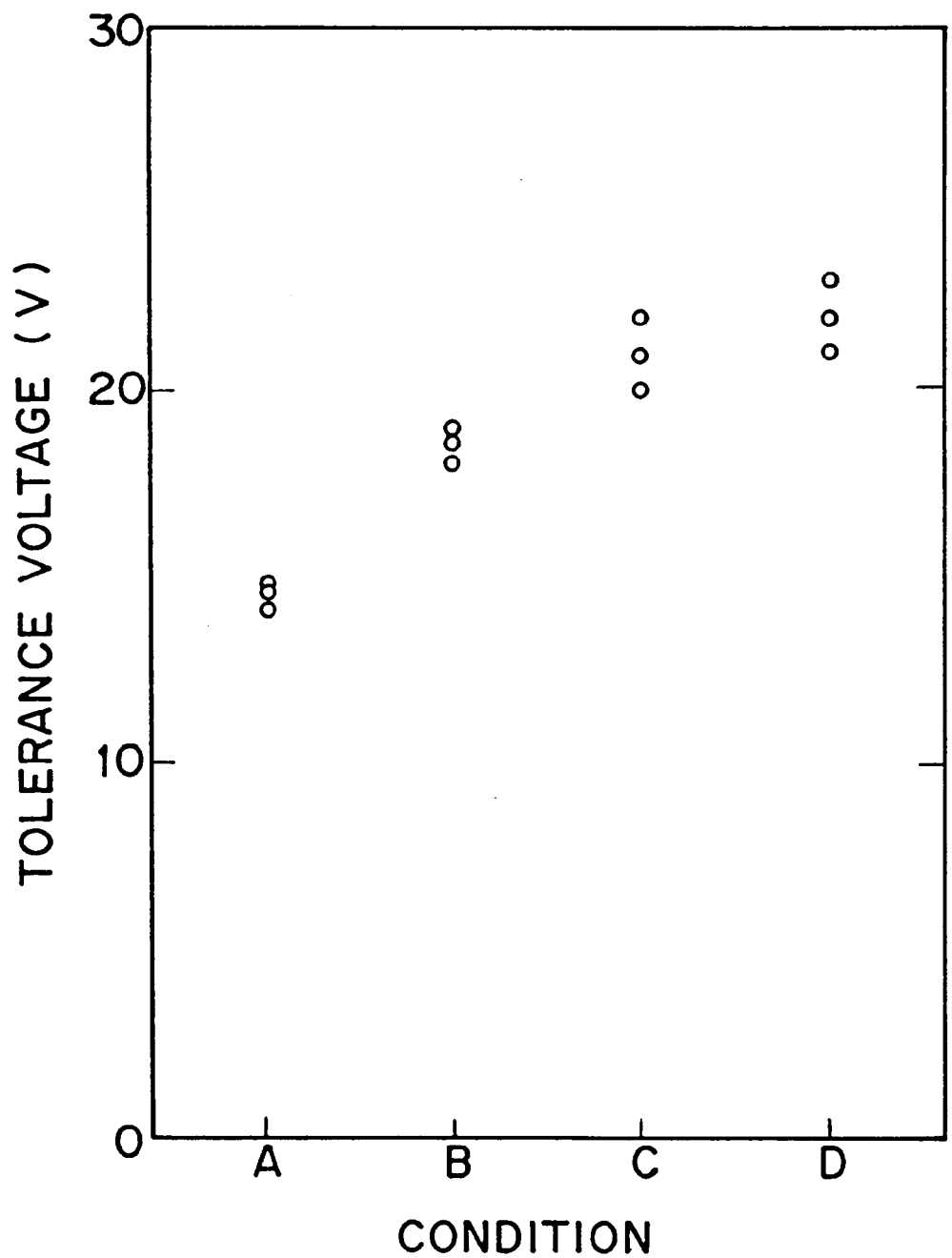
FIG. 9 is a graph showing tolerance voltages of thermal oxide layers of CCD registers fabricated under various conditions, with a vertical axis representative of the tolerance voltage of the thermal oxide layer and a horizontal axis of the condition.

FIG. 9 is a graph showing the tolerance voltage of the thermal oxide layer of the CCD register fabricated in various condition with taking the tolerance voltage of the thermal oxide layer in vertical axis and the condition in the horizontal axis. In FIG. 9, conditions A and B are comparative examples, the conditions C and D are the embodiments of the present invention.

The CCD register under the condition A is fabricated by the following fabrication process similarly to the fabrication process of the conventional CCD register shown in Figs, 5A to 5D. At first, the first transfer electrodes are selectively formed on the surface of the substrate. Next, by thermal oxidation of the surface at the temperature of 850 to 950° C., the thermal oxide layer is formed in the thickness of 2000 Å. Subsequently, second transfer electrodes are formed between adjacent first transfer electrodes. However, in the condition A, high temperature rapid annealing process is not performed.

The CCD register under the condition B is fabricated through the following fabrication process. At first, the first transfer electrodes are selectively formed on the surface of the substrate. Next, the surface is thermal oxidized in the similar manner to the foregoing condition A. Subsequently, rapid annealing is performed for 30 seconds at a temperature of 1100° C. Thereafter, the second transfer electrodes are formed in the same condition as that of the condition A.

Figure 1:
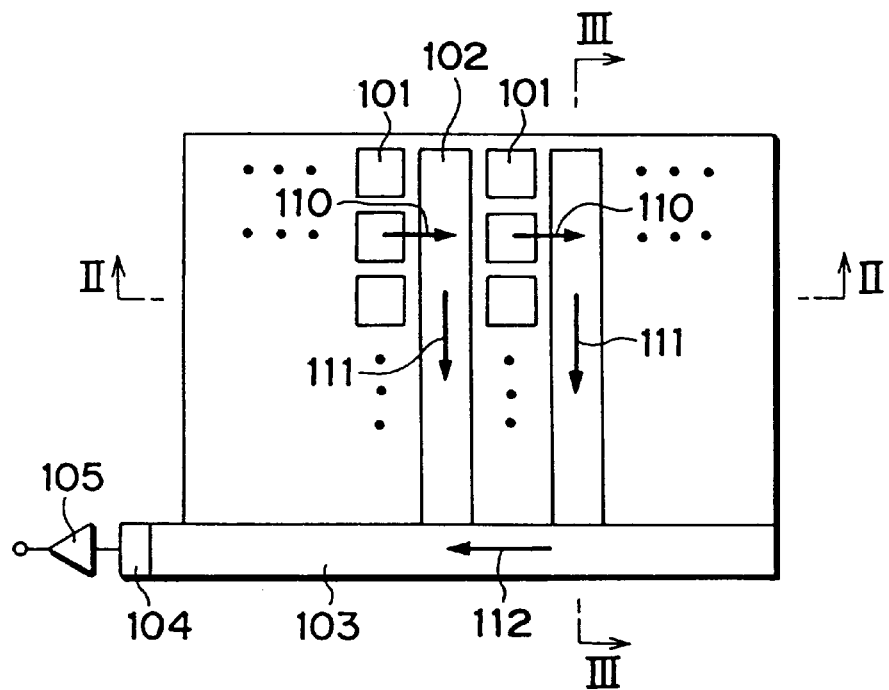
FIG. 1 is a plan view showing a construction of the conventional CCD-type two-dimensional solid-state image pick-up device.
Figure 2:
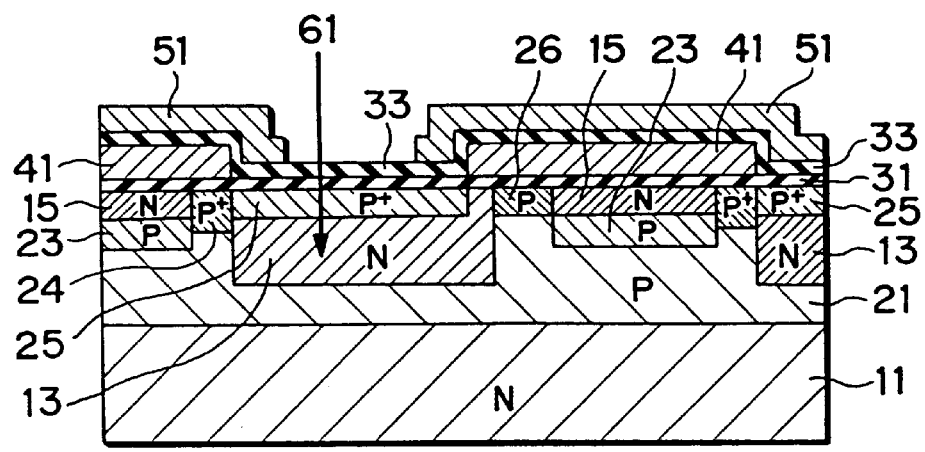
FIG. 2 is an illustration showing a part of section taken along line II—II of FIG. 1.
Figure 3:
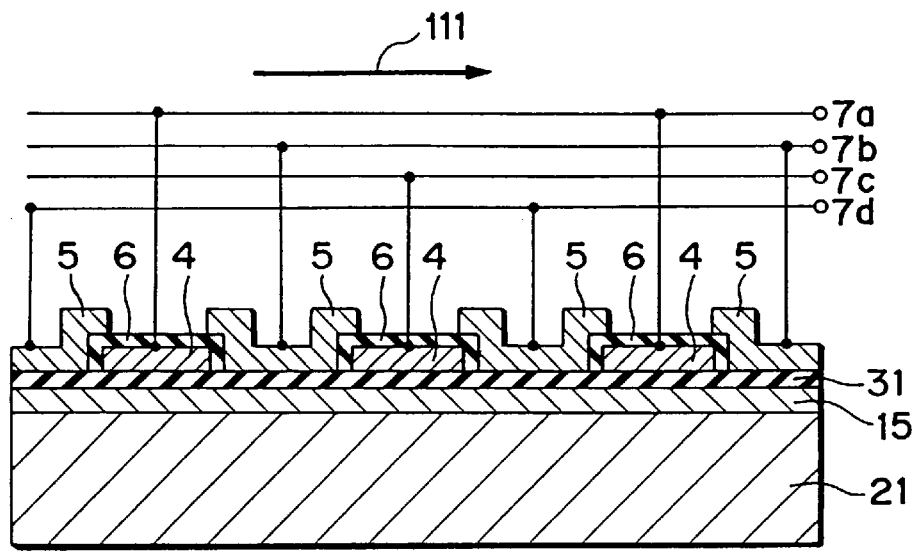
FIG. 3 is a section taken along line III—III of FIG. 1.
Figure 4:
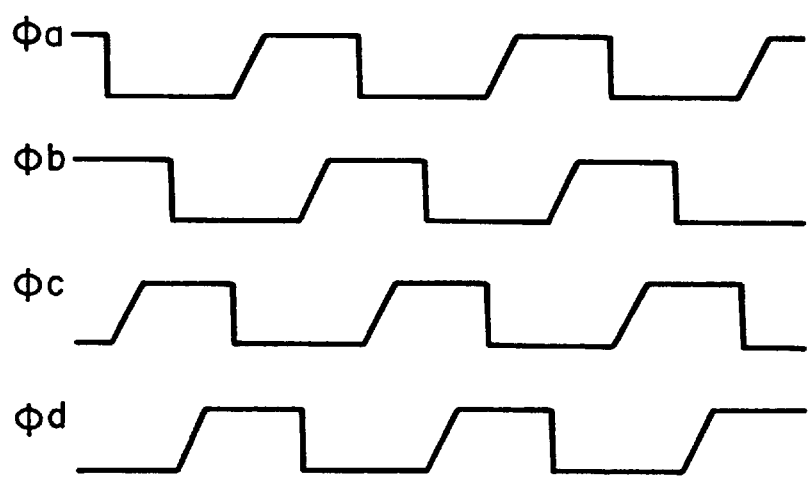
FIG. 4 is an illustration showing a waveform of a voltage pulse applied to transfer electrodes from voltage supply lines 7a to 7d.
Figure 5A:
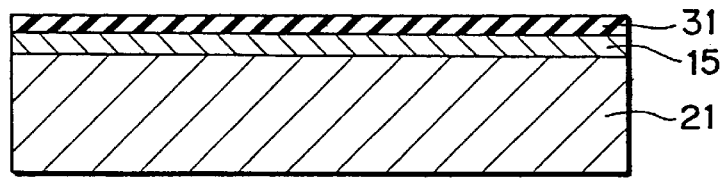
FIGS. 5A to 5D are sections showing process steps in a fabrication process for the conventional CCD register in sequential order.
Figure 5B:
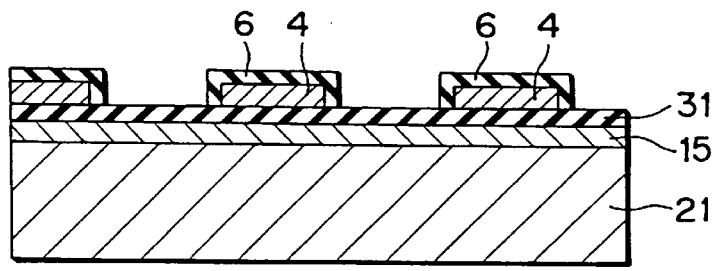
Figure 5C:
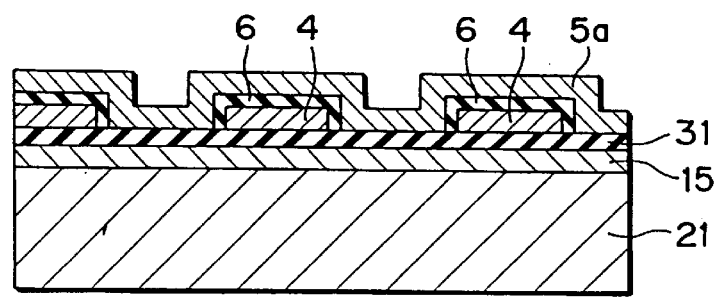
Figure 5D:
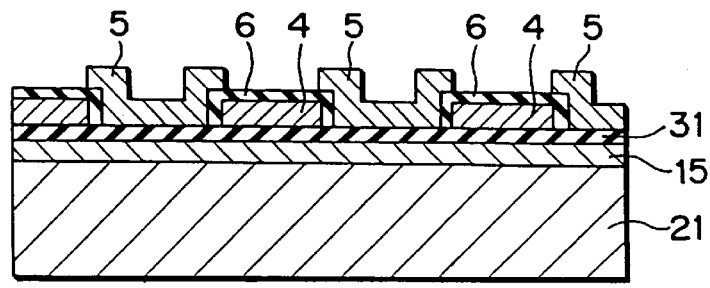

The CCD register under the condition C is fabricated through the following fabrication process. As shown in FIGS. 5A to 5C, at first, the first transfer electrodes are selectively formed on the surface of the substrate. Next, thermal oxidation is performed for the surface in the same method as that of the condition A. Subsequently, similarly to the condition A, the polycrystalline silicon layer to be the second transfer electrodes is formed. Then, rapid annealing is performed at a temperature of 1100° C. for 30 seconds. Next, the polycrystalline silicon layer is patterned to form second transfer electrodes.

The CCD register under the condition D is fabricated through the following fabrication process. At first, similarly to the condition A, the first transfer electrodes, the thermal oxide layer and the second transfer electrodes are formed on the substrate. Then, after forming a covering oxide layer on the surface of the second transfer electrodes, rapid annealing is performed at a temperature of 1100° C. for 30 seconds.

As shown in FIG. 9, under the condition A the tolerance voltage of the thermal oxide layer was 14 to 15 V and thus cannot satisfy the required tolerance voltage. On the other hand, under the condition B, the tolerance voltage of the thermal oxide layer was 18 to 19 V, the tolerance voltage becomes higher than the tolerance voltage of the thermal oxide layer under the condition A. This is because the thermal oxide layer is fluidized by the high temperature annealing to smooth the interface of the polycrystalline silicon layer.

On the other hand, in the CCD register fabricated under the condition C, the tolerance voltage of the thermal oxide layer was 20 to 22 V, and in the CCD register fabricated under the condition D, the tolerance voltage of the thermal oxide layer was 21 to 23 V.

As set forth, the conditions C and D exhibits improvement of the tolerance voltage in comparison with the condition B, in which the annealing is performed immediately after thermal oxidation for the surface of the first transfer electrodes. The followings are considered to be the reason.

In the condition B, after forming the thermal oxide layer on the surface of the first transfer electrodes, annealing is performed by lamp heating. The light irradiated into the surface of the thermal oxide layer passes through the thermal oxide layer and is absorbed in the polycrystalline silicon layer forming the first transfer electrodes and the semiconductor substrate to heat them. Accordingly, the thermal oxide layer is heated by radiation heat from the polycrystalline silicon layer and the semiconductor substrate. Namely, since the thermal oxide layer is heated from one side, heating efficiency becomes low.

On the other hand, in the condition C, a part of the irradiated light is absorbed in the polycrystalline silicon layer to be the second transfer electrodes, and also in the semiconductor substrate. Accordingly, the thermal oxide layer is heated by the irradiation heat from the polycrystalline silicon layer located upper side thereof and also from the first electrodes located at back side. Thus heating efficiency can be improved. Also, in the condition D, the thermal oxide layers in the region influenced by the tolerance voltage are disposed between the first transfer electrodes and the second transfer electrodes. Therefore, the thermal oxide layer can be efficiently heated and the tolerance voltage thereof can be improved.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A fabrication process of a solid-state image pick-up device with a CCD register comprising the steps of:

selectively forming first electrodes of polycrystalline silicon on a semiconductor substrate;

forming thermal oxide layers by thermal oxidizing the surface of said first electrodes;

forming a polycrystalline silicon layer over said substrate;

performing annealing said first electrodes, said thermal oxide layers and said polycrystalline silicon layer at a temperature higher than or equal to 1000° C. by heating by lamp; and patterning said polycrystalline silicon layer to form second electrodes between said first electrodes.

2. A fabrication process of the solid-state image pick-up device as set forth in claim 1, which further comprises a step of diffusing impurity in said polycrystalline silicon layer between the step of forming said polycrystalline silicon layer and the step of performing annealing.

3. A fabrication process of the solid-state image pick-up device as set forth in claim 2, which further comprises a step of forming an insulation layer on the surface of said polycrystalline silicon layer between the step of diffusing the impurity and the step of performing annealing.

4. A fabrication process of the solid-state image pick-up device as set forth in claim 1, wherein said step of forming said thermal oxide layers is the step of thermally oxidizing the surface of said first electrodes at a temperature of 800 to 950° C.

5. A fabrication process of the solid-state image pick-up device as set forth in claim 1, wherein the thickness of said thermal oxide layer is 0.1 to 0.15 μm.

6. A fabrication process of the solid-state image pick-up device as set forth in claim 1, wherein said annealing is performed at a temperature in a range of 1000 to 1200° C.

7. A fabrication process of the solid-state image pick-up device as set forth in claim 1, which further comprises a step of forming a gate insulation layer on the surface of said semiconductor substrate before the step of forming said first electrodes.

8. A fabrication process of the solid-state image pick-up device as set forth in claim 7, wherein said gate insulation layer is made of oxide layer.

9. A fabrication process of the solid-state image pick-up device as set forth in claim 7, wherein said gate insulation layer is made of stacked layer of an oxide layer and a nitride layer.

10. A fabrication process of a solid-state image pick-up device with a CCD register comprising the steps of:

selective forming first electrodes of polycrystalline silicon on a semiconductor substrate;

forming a thermal oxide layers by thermal oxidizing the surface of said first electrodes;

forming a polycrystalline silicon layer over said substrate;

patterning said polycrystalline silicon layer to form second electrodes between said first electrodes; and performing annealing said first electrodes, said thermal oxide layer and said second electrodes at a temperature higher than or equal to 1000° C. by heating by lamp.

11. A fabrication process of the solid-state image pick-up device as set forth in claim 10, which further comprises a step of diffusing impurity in said polycrystalline silicon layer between the step of forming said polycrystalline silicon layer and the step of forming the second electrodes.

12. A fabrication process of the solid-state image pick-up device as set forth in claim 10, which further comprises a step of forming an insulation layer on the surface of said second electrodes between the step of forming said second electrodes and the step of performing annealing.

13. A fabrication process of the solid-state image pick-up device as set forth in claim 10, wherein said step of forming said thermal oxide layers is the step of thermally oxidizing the surface of said first electrodes at a temperature of 800 to 950° C.

14. A fabrication process of the solid-state image pick-up device as set forth in claim 10, wherein the thickness of said thermal oxide layer is 0.1 to 0.15 μm.

15. A fabrication process of the solid-state image pick-up device as set forth in claim 10, wherein said annealing is performed at a temperature in a range of 1000 to 1200° C.

16. A fabrication process of the solid-state image pick-up device as set forth in claim 10, which further comprises a step of forming a gate insulation layer on the surface of said semiconductor substrate before the step of forming said first electrodes.

17. A fabrication process of the solid-state image pick-up device as set forth in claim 16, wherein said gate insulation layer is made of oxide layer.

18. A fabrication process of the solid-state image pick-up device as set forth in claim 16, wherein said gate insulation layer is made of stacked layer of an oxide layer and a nitride layer.

* * * * *